United States Patent [19]
Dickes et al.

[11] Patent Number: 4,510,461
[45] Date of Patent: Apr. 9, 1985

[54] PHASE LOCK LOOP HAVING SWITCHABLE FILTERS AND OSCILLATORS

[75] Inventors: Eric J. Dickes, Hillsboro; Thomas C. Hill, III; Robert T. Flegal, both of Beaverton, all of Oreg.

[73] Assignee: Tektronix, Inc., Beaverton, Oreg.

[21] Appl. No.: 401,051

[22] Filed: Jul. 22, 1982

[30] Foreign Application Priority Data

Sep. 1, 1981 [JP] Japan .............................. 56-137677

[51] Int. Cl.³ .............................................. H03L 7/10
[52] U.S. Cl. ..................................... 331/1 A; 331/2; 331/8; 331/16; 331/17; 331/27; 331/36 C; 331/111; 331/DIG. 2
[58] Field of Search ................. 331/1 A, 2, 8, 14, 16, 331/17, 25, 27, 36 R, 36 C, 111, 34, DIG. 2

[56] References Cited

U.S. PATENT DOCUMENTS

| | | |
|---|---|---|
| 3,431,509 | 3/1969 | Andrea .................................. 331/25 |
| 3,538,450 | 11/1970 | Andrea et al. .................... 331/25 X |
| 3,729,688 | 4/1973 | Cerny, Jr. et al. ............... 331/25 X |
| 3,909,735 | 9/1975 | Anderson et al. ........ 331/DIG. 2 X |

*Primary Examiner*—Siegfried H. Grimm
*Attorney, Agent, or Firm*—George T. Noe

[57] ABSTRACT

A phase lock circuit including a phase/frequency detector, a plurality of selectable filters, and a plurality of variable frequency signal generators connected in a loop to lock an output signal to an input signal. An out-of-frequency-range condition detector is provided to facilitate automatic selection of an appropriate in-range combination of filter and signal generator to cause lock to occur.

5 Claims, 8 Drawing Figures

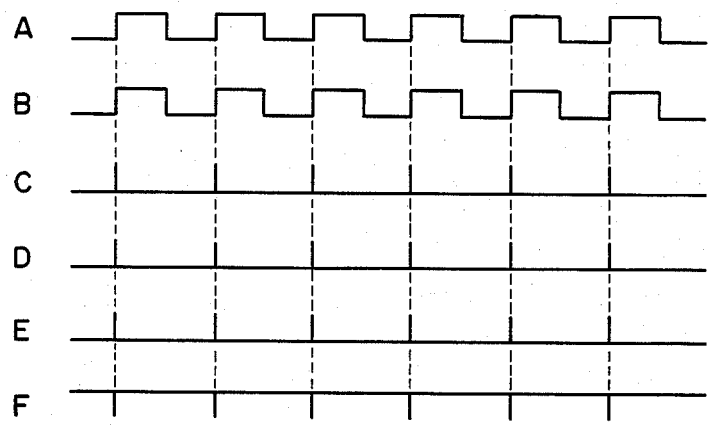
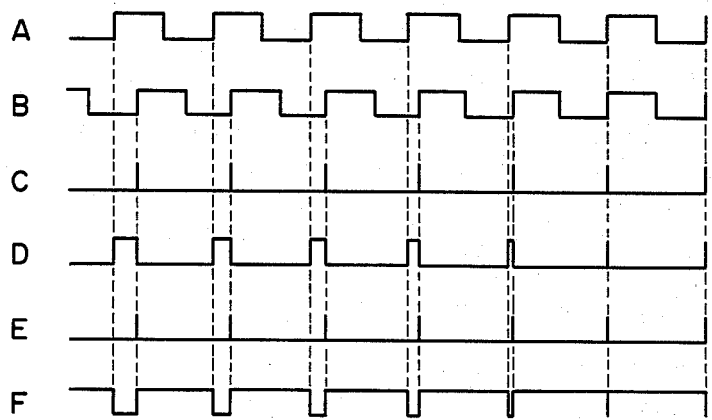
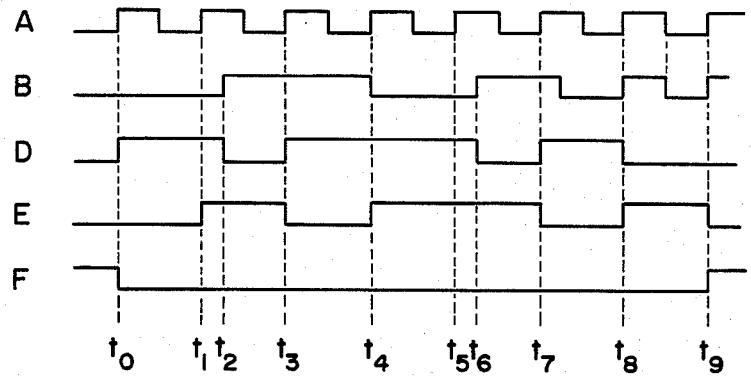

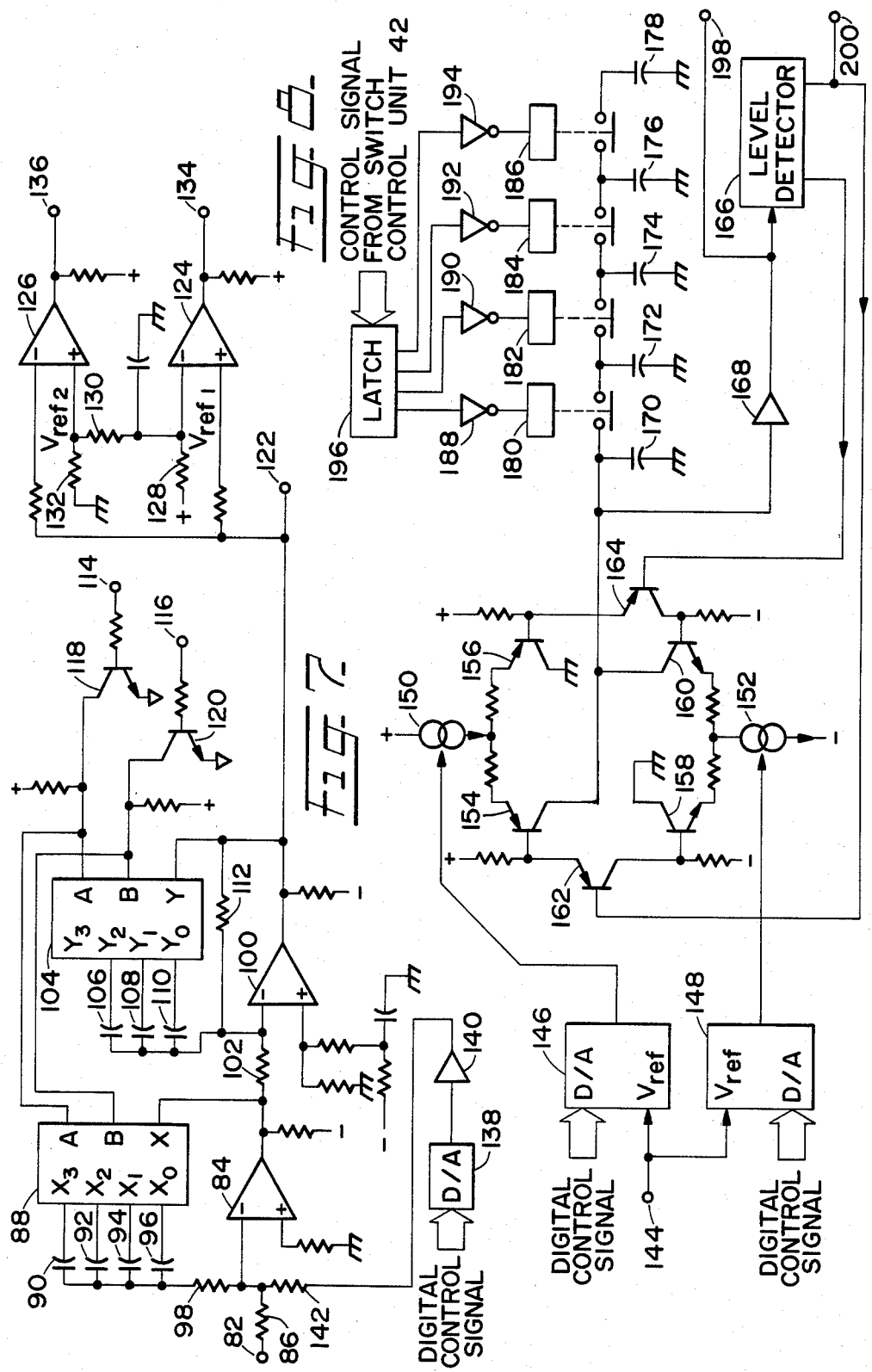

PHASE LOCK LOOP HAVING SWITCHABLE FILTERS AND OSCILLATORS

BACKGROUND OF THE INVENTION

Phase-lock circuits are well-known in the art and are used in many situations in which it is desired to synchronize an output signal with an input signal by locking the phase of the output signal to that of the input signal. Such prior art phase-lock circuits in general include a phase detector, a loop filter, and a voltage-controlled oscillator (VCO). One disadvantage of conventional phase-lock circuits is that the acquisition range in which lock can occur, that is, the ratio of an input signal frequency $F_{in}$ to an output signal frequency $F_{out}$, is typically limited to just a few percent (e.g., 5% to 20%). One reason for this is that, in general, a simple phase detector is used rather than a phase/frequency detector. Also, the frequency variation range of the VCO is limited. If the input signal frequency is outside the acquisition range of the output signal frequency, then the two frequencies must somehow be brought closer together (perhaps even by changing the VCO range) in order to allow lock to occur.

SUMMARY OF THE INVENTION

In accordance with the present invention, a phase-lock circuit is provided in which the lock range is extended to many decades of frequency ratios. A preferred embodiment includes a phase/frequency detector capable of both phase and frequency detection, a plurality of switchable loop filters and voltage-controlled oscillators to provide a wide acquisition range, and range detectors (both over and under) to sense when a particular VCO range is exceeded in either direction so that a new filter-VCO combination may be selected.

It is therefore one object of the present invention to provide an improved phase-lock circuit which extends an acquisition range to many decades of frequency ratios.

It is another object of the present invention to provide an improved phase-lock circuit which automatically selects an appropriate filter and VCO combination in accordance with the phase difference between an input signal frequency and the present oscillation frequency of the VCO.

Other objects and attainments of the present invention will become apparent to those having ordinary skill in the art upon a reading of the following description when taken in conjunction with the accompanying drawings.

DRAWINGS

FIG. 4 is a waveform ladder diagram for explaining the phase comparison operation of the circuit of FIG. 3;

FIG. 5 is a waveform ladder diagram illustrating the case in which the input signal leads the output signal by a half-cycle;

FIG. 6 is a waveform ladder diagram illustrating the case in which the input signal frequency is twice that of the output signal frequency;

FIG. 7 is a circuit schematic showing the details of the switchable filters and over-range and under-range detectors used in the circuit of FIG. 2; and FIG. 8 is a circuit schematic showing the details of the voltage-controlled oscillator circuits used in the phase-lock circuit of FIG. 2.

DETAILED DESCRIPTION OF THE INVENTION

Figure 1:
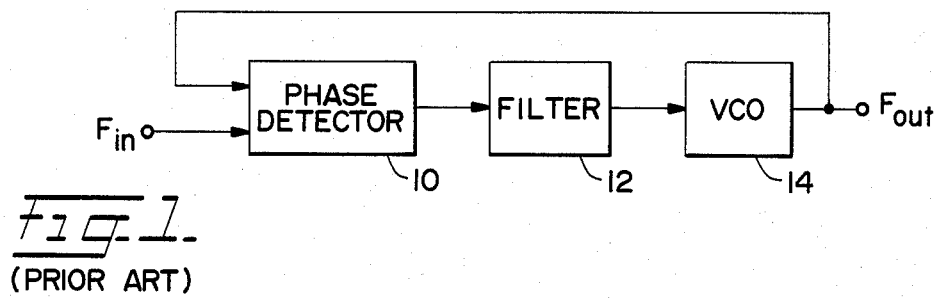
FIG. 1 is a block diagram of a conventional phase-lock circuit.

Turning now to the drawings, there is shown in FIG. 1 a conventional phase-lock circuit of the prior art consisting of a phase detector 10, a filter 12, and a voltage-controlled oscillator (VCO) 14. Phase detector 10 compares the phase of the input signal with that of the output signal from VCO 14, and generates a pulse voltage, the width of which is directly proportional to the phase difference between the two signals. Filter 12 converts the output pulse from phase detector 10 into a DC voltage to control the oscillation frequency of VCO 14. Thus, an output signal $F_{out}$ is synchronized with an input signal $F_{in}$ such that the phase of the output signal is locked to the phase of the input signal.

Figure 2:
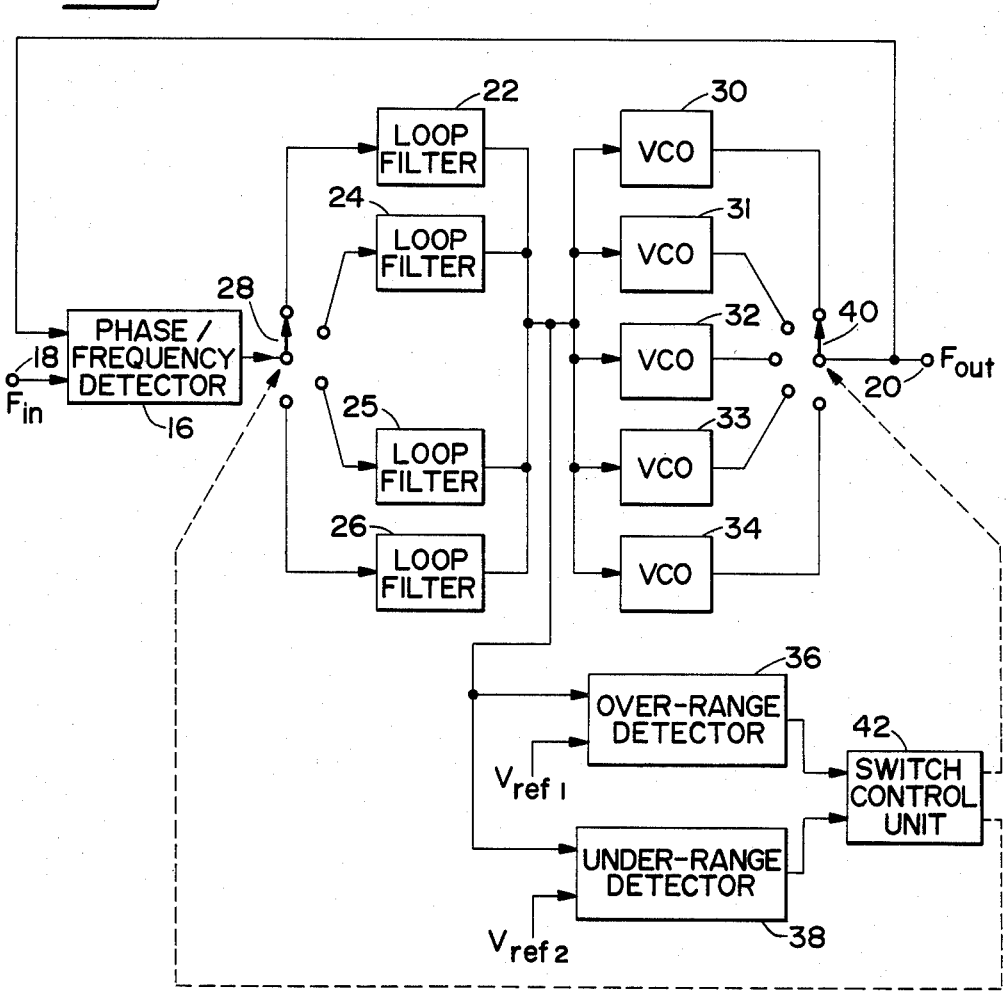
FIG. 2 is a block diagram of a preferred embodiment in accordance with the present invention.

One preferred embodiment of the present invention will be described hereinafter in detail. FIG. 2 shows a block diagram of a phase-lock circuit in accordance with the present invention. Phase/frequency detector 16 compares an input signal at terminal 18 with an output signal at terminal 20, and generates output pulses, the duty factor and frequency of which are determined by either a constant or a changing phase difference between the input and output signals. Phase/frequency detector 16 (as opposed to purely a phase detector) has two modes of operation—that of phase detection and that of frequency detection. The output thereof is proportional to phase difference for two close together frequencies and latched either high or low for frequency differences greater than 2:1. The output pulses from phase/frequency detector 16 are applied to one of a plurality of loop filters 22 through 26 via switch 28. The integrating constants of the filters are different from each other, and each filter has an own optimum pulse frequency range for converting the output pulses from phase/frequency detector 16 to a DC voltage for the best loop dynamics. The control voltage outputs of filters 22 through 26 are connected to VCOs 30 through 34, over-range detector 36 and under-range detector 38. The oscillation frequency and phase of VCOs 30 through 34 are controlled by the DC voltage output of filters 22 through 26, and the selected output of such VCOs is connected to phase/frequency detector 16 and terminal 20 via switch 40. The oscillation frequency ranges of VCOs 30 through 34 are such that respective ones overlap. Over-range and under-range detectors 36 and 38 compare the output control voltage from the selected filter of loop filters 22 through 26 with reference voltages $V_{ref1}$ and $V_{ref2}$, and switch control unit 42 controls switches 28 and 40 in accordance with the outputs from detectors 36 and 38. In this embodiment, filter 22 is used with VCOs 30 and 31, filter 24 is used with VCOs 31 and 32, filter 25 is used with VCOs 32 and 33, and filter 26 is used with VCOs 33 and 34. The frequency ranges of filters 22 through 26 are set from the lower frequency range upward, and the frequency ranges of VCOs 30 through 34 are set from the lower frequency range upward. Filters 22 and 24 and VCOs 30 and 31 cover a low frequency range; filters 24 and 25 and VCOs 31, 32 and 33 cover a middle frequency range; and filters 25 and 26 and VCOs 33 and 34 cover a high frequency range. Switch control unit 42 may be a system including a microprocessor, a random access memory as a temporary memory and a read only memory for firmware.

When switches 28 and 40 select filter 22 and VCO 30, respectively, and the input frequency $F_{in}$ is within the low frequency range, VCO 30 generates an output signal, the phase of which is locked to the input low frequency signal at terminal 18. If the input frequency $F_{in}$ increases, the phase difference between the input and output signals increases and the output DC voltage from filter 22 correspondingly increases. When this output DC voltage increases to a point which exceeds the reference voltage $V_{ref1}$, over-range detector 36 detects this situation and applies an output control signal to switch control unit 42. In accordance with this output, switch control unit 42 controls the operation of switch 40 so that it selects VCO 31. If the input frequency $F_{in}$ is within the range of VCO 31, the output control voltage from filter 22 is between the reference voltages $V_{ref1}$ and $V_{ref2}$ and switch control unit 42 does not further control switches 28 and 40. VCO 31 will become locked to the phase and frequency of the input signal. If the input frequency $F_{in}$ is higher than the range of VCO 31, the output control voltage from filter 22 will be higher than the reference voltage $V_{ref1}$ and over-range detector 36 generates a control output voltage which is applied to switch control unit 42. Switch control unit 42 controls switches 28 and 40 so that they select blocks 24 and 32. As described earlier, if the input frequency $F_{in}$ continues to increase, filters 25 and 26 and VCOs 33 and 34 are selected in this order.

When switches 28 and 40 select filter 26 and VCO 34 and the input frequency $F_{in}$ is lower than the range of VCO 34, the output voltage from filter 26 decreases. Since the output from filter 26 is lower than the reference voltage $V_{ref2}$, under-range detector 38 applies an output control signal to switch control unit 42. According to the operation of switch control unit 42, switch 28 selects VCO 33. If the input signal frequency $F_{in}$ is in the range of VCO 33, the output signal frequency $F_{out}$ from VCO 33 becomes locked to the input signal frequency $F_{in}$. If the input signal frequency $F_{in}$ is lower than the range of VCO 33, switches 28 and 40 select loop filter 25 and VCO 32. If the input signal frequency $F_{in}$ further decreases, filters 24 and 22 and VCOs 31 and 30 are selected in this order. Thus, it can be appreciated that the present invention can extend the lock range of the phase lock circuit.

Figure 3:
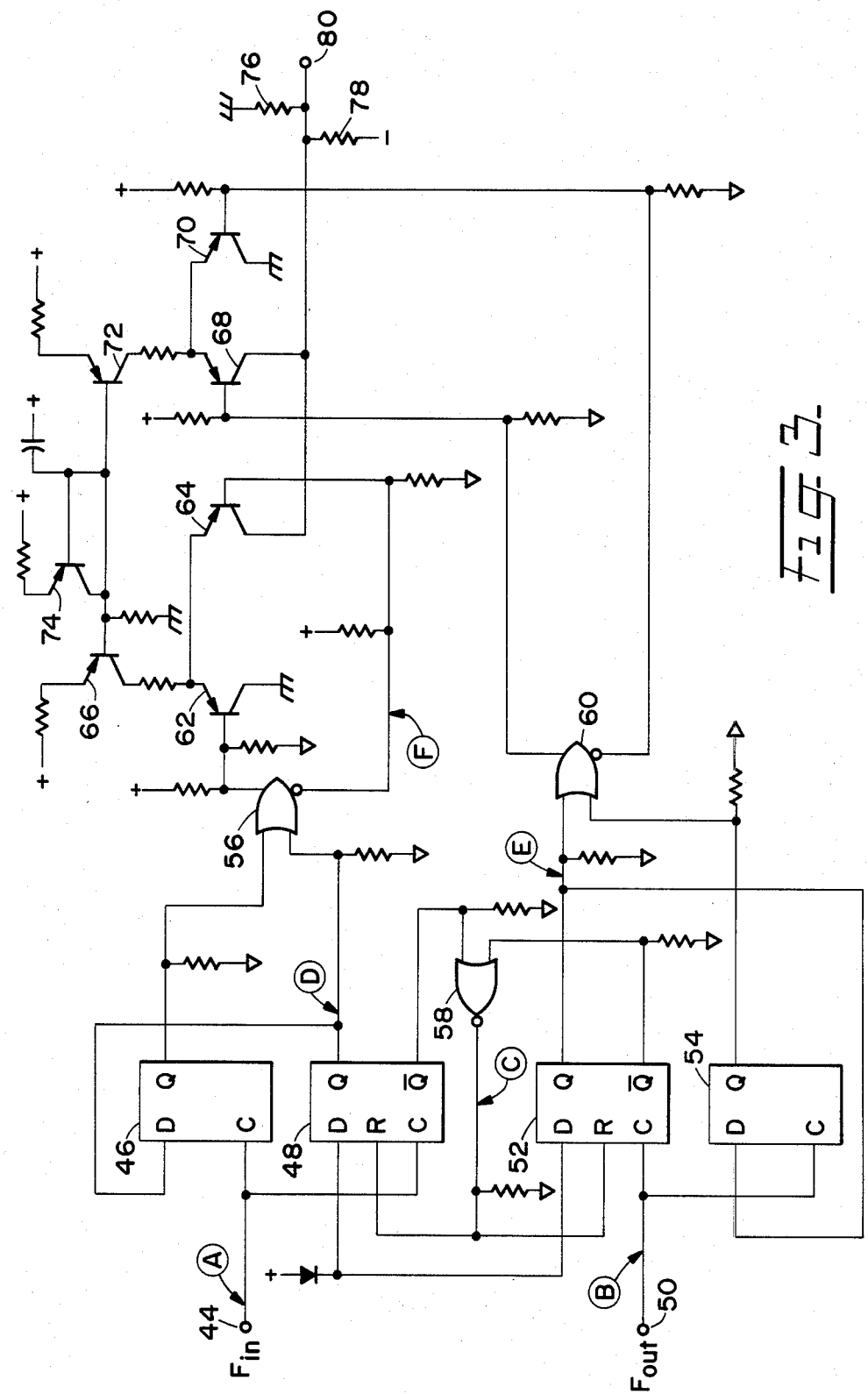
FIG. 3 is a detailed circuit schematic of a phase/frequency detection circuit employed by the present invention.

FIG. 3 shows a circuit schematic of phase/frequency detector 16 used in FIG. 2. Terminal 44 receives the input signal $F_{in}$ from terminal 18 (of FIG. 2), and is connected to the clock terminals of flip-flops 46 and 48. Terminal 50 receives the output signal $F_{out}$ from terminal 20, and is connected to the clock terminals of flip-flops 52 and 54. The Q outputs of flip-flops 46 and 48 are applied to OR gate 56, and the D input terminal of flip-flop 46 is connected to the Q output terminal of flip-flop 48. NOR gate 58 receives the Q̄ outputs from flip-flops 48 and 52, to reset them. OR gate 60 receives the Q outputs from flip-flop 52 and 54, and the D input terminal of flip-flop 54 receives the Q output from flip-flop 52. The D input terminals of flip-flops 48 and 52 receive a suitable positive supply voltage through a diode. The non-inverting and inverting outputs from OR gate 56 control a first current switch consisting of emitter coupled transistors 62–64 and constant current source transistor 66. The non-inverting and inverting outputs from OR gate 60 control a second current switch consisting of emitter coupled transistors 68–70 and constant current source transistor 72. These current switches form a charge pump to furnish current to the loop filter connected to output terminal 80. The bases of transistors 66 and 72 are connected to a voltage divider consisting of resistors and temperature compensation transistor 74 connected as a diode. The collectors of transistors 64 and 68 are connected to the common junction of resistors 76 and 78 and terminal 80. The signal waveforms A through F of FIGS. 4 through 6 appear at points indicated by Ⓐ through Ⓕ in FIG. 3.

The operation of FIG. 3 is as follows. Refer to FIG. 4, which depicts some of the output waveforms in the phase comparison mode. For this discussion, assume that the two signals A and B (the input and output signals, respectively) are equal in phase and frequency, as depicted. Also assume that all four flip-flops 46-48-52-54 have just been reset. As the first positive transition occurs (since the signals will never be precisely in phase, assume that the $F_{in}$ signal A leads slightly), flip-flop 48 sets. Neither flip-flops 52 and 54 will set, since the $F_{out}$ signal has not yet arrived, and flip-flop 46 cannot set, since a low level is at terminal D of flip-flop 46(D) when the edge of signal $F_{in}$, which may be a trigger signal, arrives. The logical high of signal D enables gate 56 to turn on transistor 64 to begin driving the next stage, the charge pump for the loop filter, to increase the loop frequency, and the low from Q̄ of flip-flop 48 permits flip-flop 48 to control the output of gate 58, which is still low. (The high state of signal D is also applied to the D input of flip-flop 46 to arm that flip-flop for the next incoming trigger cycle of $F_{in}$.) Before the circuits can really begin the charge pump action, the positive edge of the $F_{out}$ signal, which may be an internal square-wave signal produced by a VCO, occurs, setting the flip-flop 52. Flip-flop 54 cannot set because signal E is low when the clock edge occurs. The set condition of flip-flop 52 causes signal E to go high, and Q̄ of flip-flop 52 to go low. This low is applied to gate 58, which resets both flip-flops and terminates the charge pump drive signal. The result is an output pulse that is very little wider than the propagation time of gate 58 and the time difference between the two flip-flops 48 and 52, thus containing just enough energy to affect the charge pump output, and slightly shift the frequency. As illustrated in FIG. 4, the resultant output of the circuit at terminal 80 is a series of very narrow pulses that first drive the phase-locked loop slightly up in frequency, then slightly down, averaging to the frequency of the applied trigger signal $F_{in}$.

Refer to FIG. 5, which illustrates the case that occurs when the trigger signal $F_{in}$ leads the loop signal $F_{out}$ by a half-cycle, so the phase is different, and the frequency is also somewhat different. The first positive edge of $F_{in}$ signal A sets flip-flop 48, which arms flip-flop 46, begins the pump-up signal to the charge pump via gate 56, and enables gate 58. Before the next positive edge of signal A occurs, the square-wave B sets flip-flop 52 and resets both flip-flops 48 and 52 through the output of gate 58. This terminates the charge pump signal F. The phase lock loop filter can respond to a pulse of this width, so the loop frequency is altered upwards slightly. The next positive edge of signal A again sets flip-flop 48, and the process is repeated. Note, though, that the pulse width of the second charge signal F is narrower, and continues to decrease with succeeding cycles. Finally, the phase-lock loop adjusts the frequency to the point that the positive edge of signal B leads the positive of signal A indicating that the correction process has overshot the center mark. Then, the process is reversed, until the circuit rocks back and forth over the in-phase mark, as just explained.

Refer to FIG. 6 which illustrates the case that occurs when signal A is more than twice the frequency of signal B. In theory, the inner latches 48 and 52 (phase detector) could cope with this magnitude of disparity in frequency, but the process would be slow, and would temporarily reverse when phase crossings occurred, such as when the frequency of one signal was twice or three times the other.

The first positive edge of signal A sets flip-flop 48, which arms flip-flop 46 to set at the next transition if signal B does not arrive first. This does not occur, since signal A is more than three times faster than the square-wave B, in this case. The second positive edge, at $t_1$, sets flip-flop 48. The positive level at Q of flip-flop 46 has no effect on the gate for now, since the other input is already high from the set state of flip-flop 48. At $t_2$, the square-wave signal B sets flip-flop 52, which resets flip-flop 48. This has no effect on the output of gate 56 which is still held by Q of flip-flop 46. At $t_3$, flip-flop 48 is once again set, and in the absence of the high of signal D is reset. Again, this has no effect on the output of gate 56, since signal D rises just as Q of flip-flop 46 falls. At $t_4$, flip-flop 46 sets, having been enabled to do so by the high state of signal D. Both flip-flops ignore the positive edge that occurs at $t_5$, since both are set. At $t_6$, the positive edge of the square-wave signal B sets flip-flop 52 which resets both inner latches 48 and 52 again.

As the output of gate 56 continues to stay high, the phase-lock loop continues to increase the frequency of the output signal. Finally, at $t_8$, the signals coincide, and at $t_9$, the very short pulses that mark phase tracking begin to appear, and the inner latches 48 and 52 assume the detection function as discussed earlier.

The output signal from gate 56 is a bipolar drive signal that drives one-half of the charge pump circuit. The output of gate 60 is a similar signal that drives the other half of the charge pump circuit. As long as the inner flip-flops 48 and 52 control the phase-lock process, both of these output lines stay high, and a control circuit (not shown) is informed that the signals are locked. If either of the outer flip-flops 46 or 54 sets, that output line goes low to warn the control circuit that the signals are no longer locked together.

FIG. 7 is a circuit schematic of the loop filters and over-range and under-range detectors 36 and 38 used in FIG. 2. Terminal 82 receives the output voltages from terminal 80 in FIG. 3, and is connected to the inverting input terminal of operational amplifier 84 through current-setting resistor 86. Multiplexer 88, timing capacitors 90 through 96 and resistor 98 are inserted between the output and inverting input terminals of operational amplifier 84 and thereby form a first Miller integrator. In multiplexer 88, the terminal X is selectively connected to one of the terminals $X_0$ through $X_3$ in response to two-bit control signal at terminals A and B thereby to complete the capacitive feedback loop of the Miller integrator. The non-inverting input terminal of operational amplifier 84 is grounded through a resistor. The output from the first Miller integrator, that is, operational amplifier 84, is connected through resistor 102 to the inverting input terminal of operational amplifier 100 with the non-inverting input terminal thereof receiving a proper voltage from a voltage divider. Multiplexer 104, capacitors 106 through 110 and resistor 112 are inserted between the output and inverting input terminals of operational amplifier 100. Multiplexer 104 is the same as multiplexer 88, and control terminals A and B thereof receive the control signal from switch control 42 through terminals 114 and 116 and buffer transistors 118 and 120. When the terminal Y of multiplexer 104 is connected to the terminal $Y_3$, operational amplifier 100 operates as a voltage follower inverter with resistor 112 being the single feedback element. When the terminal Y is connected to one of the terminals $Y_0$, $Y_1$ and $Y_2$, operational amplifier 100 operates as a second Miller integrator. The first and second Miller integrators form an active filter, and the characteristic thereof is selected by the control signal at terminals 114 and 116. Therefore, this active filter produces the DC output voltage at terminal 122 in accordance with the integrated pulse voltage at terminal 82. Multiplexers 88 and 104 correspond to switch 28 in FIG. 2.

Comparators 124 and 126 compare the output voltage at terminal 122 with the reference voltages $V_{ref1}$ and $V_{ref2}$ produced by a voltage divider consisting of resistors 128, 130 and 132. Comparators 124 and 126 respectively correspond to over- and under-range detectors 36 and 38, and terminals 134 and 136 are connected to switch control 42.

Under normal operating conditions, VCO 30, 32 or 34 generates the output signal the phase of which is the same as the input signal at terminal 82. Sometimes an output signal is needed which is a predetermined degree of out-of-phase with reference to the input signal. For this object, the inverting input terminal of operational amplifier 84 receives a second input voltage from digital-to-analog (D/A) converter 138 through buffer 140 and input resistor 142. D/A converter 138 receives a control digital signal from a control circuit (not shown) such as a microprocessor system. The operator sets the desired degree so that D/A converter 138 applies the DC voltage to the first Miller integrator. Since filters 22 through 26 are active filters, Miller integrators, it is easy to sum two input voltages. If current is added to or removed from the summing input of operational amplifier 84, the loop will lock with whatever duty cycle and polarity is required to cancel out the offset. By this means the phase difference between input 50 and output 44 is programmed by D/A converter 138.

FIG. 8 shows a circuit schematic of VCOs 30 through 34 and switch 40. Terminal 144 receives the DC voltage from terminal 122, and is connected to the reference terminals $V_{ref}$ of D/A converters 146 and 148 which receive digital signals from the control circuit (not shown). However, the digital signals are set to predetermined values in the phase lock mode. The analog outputs from D/A converters 146 and 148 control current sourcing circuit 150 and current sinking circuit 152. Since the analog outputs from D/A converters 146 and 148 vary in accordance with the DC voltage at terminal 144, this DC voltage controls the output current values of current sources 150 and 152. Current source 150 supplies the current to a first current switch consisting of emitter coupled transistors 154 and 156, and current source 152 sinks the current from a second current switch consisting of emitter coupled transistors 158 and 160. Transistors 154 and 158 are controlled by transistor 162, transistors 156 and 160 are controlled by transistor 164, and the bases of transistors 162 and 164 receive push-pull pulses from level detector 166. The collectors of transistors 156 and 158 are grounded, and the collectors of transistors 154 and 160 are connected to buffer 168 and capacitor 170. Capacitors 172 through 178 are selectively connected in parallel with capacitor 170 by electromagnetic relays 180 through 186. These relays are controlled via buffers 188 through 194 by latch circuit 196 which receives a control signal from switch control unit 42. Level detector 166 detects predetermined upper and lower levels of the output from buffer 168, and generates the push-pull pulse which changes logic levels (high or low) with each detection of the upper and lower levels of buffer 168.

When transistors 154 and 158 are on and transistors 156 and 160 are off, the current from current source 150 charges the capacitor(s) selected from capacitors 170 through 178. A positive going ramp is produced across the capacitor(s). When level detector 166 detects the upper level of the ramp, the logic levels of the push-pull pulse from detector 166 exchange so that transistors 154 and 158 turn off and transistors 156 and 160 turn on. Current source 152 sinks the current from the capacitor(s) and a negative going ramp is produced across the capacitor(s). When level detector 166 detects the lower level of the negative going ramp, the logic levels from detector 166 exchange so that the capacitor(s) is charged again by current source 150. The above operations repeat, and a triangle waveform is obtained from terminal 198. The square wave output signal at terminal 200 is applied to terminal 20. Thus, the phase and frequency of the output signal at terminal 200 is controlled by the DC voltage at terminal 144, and the frequency range depends on the value of the capacitor(s) selected by relays 180 through 186. Relays 180 through 186 correspond to switch 40 in FIG. 2, and the other components correspond to VCOs 30 through 34. When the phase lock mode is not selected, the circuit of FIG. 5 can generate a desired frequency signal by applying desired control signals to D/A converters 146 and 148 and latch circuit 196. The DC voltage at terminal 144 is fixed to a predetermined voltage that produces the desired output frequency.

As understood from the foregoing description, the present invention can extend the lock range which is greater than 1,000,000:1.

Although the above description was made only on one preferred embodiment of the present invention, it is apparent for those skilled in the art that various modifications can be made without departing from the scope and spirit of the present invention. For example, the VCO may be other types such as an oscillator including a vari-cap diode. The filters may be passive filters instead of the active filters.

What we claim as being novel is:

1. A phase lock circuit, comprising:
   means for detecting phase and frequency differences between an input signal and an output signal and generating a detection signal representative of said differences;
   filter means responsive to said detection signal for producing a control voltage, said filter means having a plurality of selectable frequency ranges;
   variable-frequency signal generation means responsive to said control voltage for producing said output signal, said variable-frequency signal generation means having a plurality of selectable frequency ranges matchable with those of said filter means; and
   selection means responsive to said control voltage for selecting filter means and variable-frequency signal generation means having matched frequency ranges.

2. A phase lock circuit in accordance with claim 1 wherein said phase difference detecting means comprises logic circuit means for generating electrical pulses the width of which is proportional to the phase difference between said input signal and said output signal.

3. A phase lock circuit in accordance with claim 1 wherein said variable frequency signal generation means comprises a plurality of voltage-controlled oscillators each having a different frequency range.

4. A phase lock circuit in accordance with claim 1 wherein said selection means comprises means for receiving said control voltage and detecting therefrom an out-of-range condition, and means responsive to said out-of-range condition for selecting a combination of said filter means and said variable frequency signal generation means which will cause said output signal to lock to the frequency and phase of said input signal.

5. A phase lock circuit in accordance with claim 4 wherein said out-of-range condition detecting means comprises means for comparing said control voltage with first and second reference voltage levels, wherein a control voltage value in excess of said first reference voltage level indicates an over-range condition, and a control voltage value less than said second reference voltage level indicates an under-range condition.

* * * * *